(12) United States Patent
Shaeffer et al.

(10) Patent No.: US 8,970,412 B2
(45) Date of Patent: Mar. 3, 2015

(54) SIGNAL QUANTIZATION METHOD AND APPARATUS AND SENSOR BASED THEREON

(71) Applicant: Invensense, Inc., Sunnyvale, CA (US)

(72) Inventors: Derek K. Shaeffer, Redwood City, CA (US); Xiang Fang, Mountain View, CA (US)

(73) Assignee: Invensense, Inc., San Jose, CA (US)

( * ) Notice: Subject to any disclaimer, the term of this patent is extended or adjusted under 35 U.S.C. 154(b) by 1 day.

(21) Appl. No.: 13/621,819

(22) Filed: Sep. 17, 2012

(65) Prior Publication Data

US 2013/0099955 A1 Apr. 25, 2013

Related U.S. Application Data

(60) Provisional application No. 61/551,374, filed on Oct. 25, 2011.

(51) Int. Cl.
H03M 3/00 (2006.01)
H03M 7/30 (2006.01)

(52) U.S. Cl.
CPC .............. *H03M 3/39* (2013.01); *H03M 7/3015* (2013.01); *H03M 7/3028* (2013.01); *H03M 7/3031* (2013.01); *H03M 3/43* (2013.01); *H03M 3/456* (2013.01)
USPC ........... 341/143; 375/247; 341/146; 341/149; 341/160; 341/158

(58) Field of Classification Search
CPC . H03M 7/3006; H03M 7/3007; H03M 7/302; H03M 3/45; H03M 3/452; H03M 3/42; H03M 3/484; H03M 3/454; H03M 3/482; H03M 3/492; H03M 3/43; H03M 3/48; H03M 3/49; H03M 3/39; H03M 3/346; H03M 3/464; H03M 1/0663; H03M 1/0065
USPC .................................... 341/143–160; 375/247
See application file for complete search history.

(56) References Cited

U.S. PATENT DOCUMENTS 5,471,209 A * 11/1995 Sutterlin et al. .............. 341/143
6,329,939 B1 * 12/2001 Swaminathan et al. ...... 341/143
(Continued)

OTHER PUBLICATIONS

Bernhard E. Boser and Bruce A Wooley, "The Design of Sigma-Delta Modulation Analog-to-Digital Converters", IEEE Journal of Solid-State Circuits, vol. 23, No. 6, Dec. 1988.
(Continued)

*Primary Examiner* — Lam T Mai
(74) *Attorney, Agent, or Firm* — Maryam Imam; IPxLaw Group LLP

(57) ABSTRACT

A signal quantizer includes a summing junction, a loop filter, a quantizer and a reconstruction filter. The summing junction is responsive to an input signal and to a modulated signal and is operative to combine the modulated signal and the input signal to generate a summing junction output. The loop filter is responsive to the summing junction output and is operative to generate a loop filter output and has a first regenerative gain associated therewith. The quantizer is responsive to the loop filter output and is operative to generate the modulated signal. The reconstruction filter is responsive to the modulated signal and is operative to generate a quantized output signal and has a second regenerative gain associated therewith that is substantially equal to that of the loop filter.

38 Claims, 8 Drawing Sheets

(56) References Cited

U.S. PATENT DOCUMENTS

| | | | |
|---|---|---|---|
| 6,639,531 B1 * | 10/2003 | Melanson | 341/143 |
| 6,724,332 B1 * | 4/2004 | Melanson | 341/143 |
| 6,738,004 B2 * | 5/2004 | Melanson | 341/143 |
| 6,744,392 B2 * | 6/2004 | Melanson | 341/143 |
| 6,822,594 B1 * | 11/2004 | Melanson et al. | 341/143 |
| 7,928,876 B2 * | 4/2011 | Thomsen et al. | 341/143 |
| 8,018,365 B1 * | 9/2011 | Tsai | 341/143 |
| 8,223,051 B2 * | 7/2012 | Van Veldhoven | 341/143 |
| 8,248,285 B2 * | 8/2012 | Van Veldhoven | 341/143 |
| 8,629,793 B2 * | 1/2014 | Tsai | 341/143 |

OTHER PUBLICATIONS

Janos Markus, Jose Silva and Gabor C. Temes, "Theory and Applications of Incremental ΔΣ Converters", IEEE Transactions on Circuits and Systems—I: Regular Papers, vol. 51, No. 4, Apr. 2004.

Vincent Quiquempoix, Philippe Deval, Alexandre Barreto, Gabriele Bellini, Janos Markus, Jose Silva and Gabor C. Temes, "A Low-Power 22-bit Incremental ADC", IEEE Journal of Solid-State Circuits, vol. 41, No. 7, Jul. 2006.

Jacques Robert and Philippe Deval, "A Second-Order High-Resolution Incremental A/D Converter with Offset and Charge Injection Compensation", IEEE Journal of Solid-State Circuits, vol. 23, pp. 736-741, Jun. 1988.

* cited by examiner

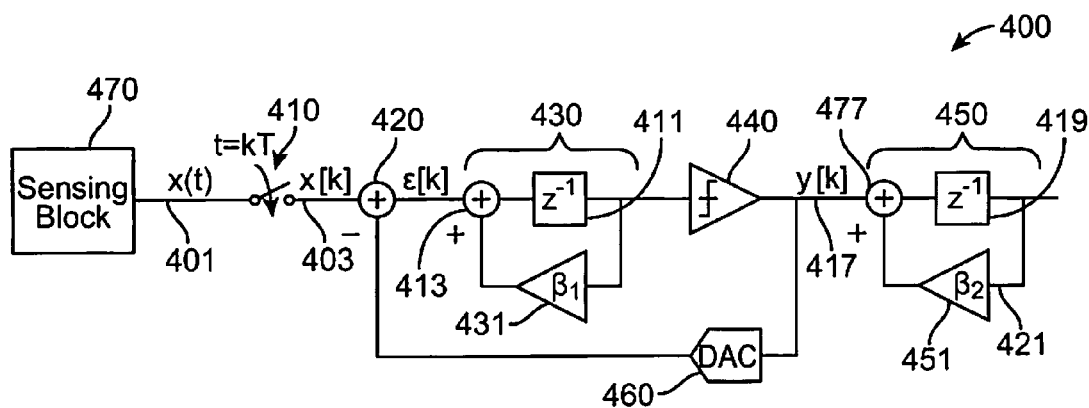
FIG. 2
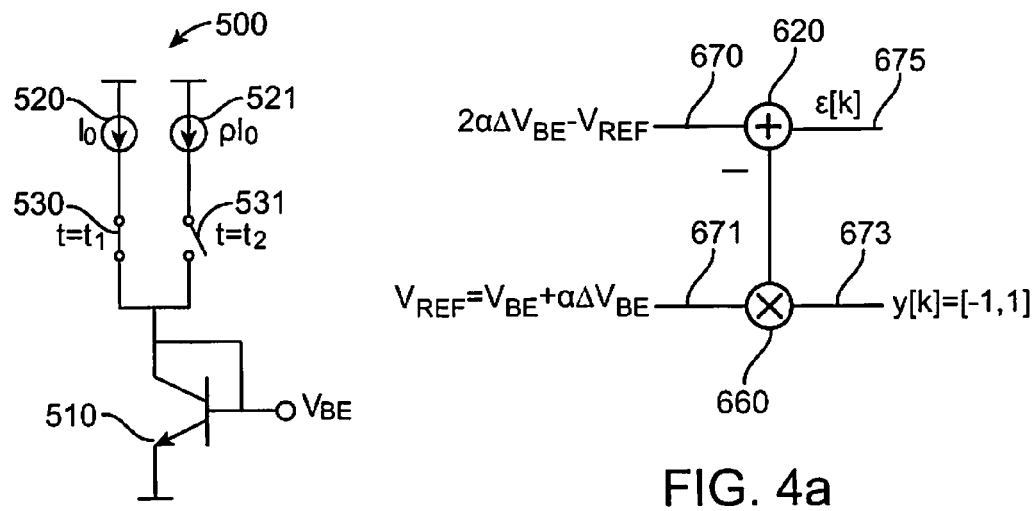
$$V_{BE}(t_2) - V_{BE}(t_1) = \Delta V_{BE} = \frac{kT}{q} \ln(\rho)$$
FIG. 3
FIG. 4a
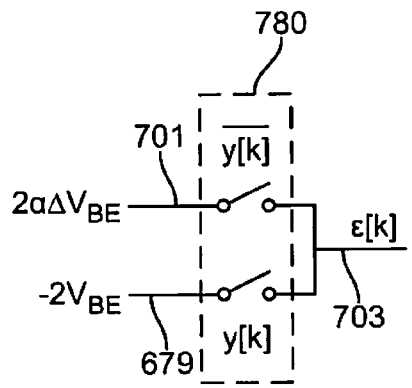
FIG. 4b

SIGNAL QUANTIZATION METHOD AND APPARATUS AND SENSOR BASED THEREON

CROSS REFERENCE TO RELATED APPLICATIONS

This application claims priority to U.S. Provisional Application No. 61/551,374 filed on Oct. 25, 2011, entitled "Temperature Sensor with Reduced Latency", by Shaeffer et al., the disclosure of which is incorporated herein by reference as though set forth in full.

BACKGROUND

Various embodiment of the invention relate generally to a signal quantizer and particularly to a signal quantizer with a regenerative gain.

A limitation of prior-art oversampled analog-to-digital converters is that they may take a significant number of samples to produce a high-resolution estimate of an input signal. For example, a sigma-delta modulator that is effectively an analog-to-digital converter and whose loop filter has only a single integrator and whose comparator is a 1-bit comparator may require approximately $2^N$ samples to produce an estimate with N-bits of resolution. Accordingly, a 12-bit estimate may require on the order of 4,096 samples or more. The large number of samples required leads to a large latency.

The foregoing limitation may be partially overcome by the use of more integrators in the loop filter of a sigma-delta modulator. The order of a modulator refers to the number of integrators used in a modulator. It can be shown that a second-order, single-bit modulator achieving 12-bit resolution estimates may require on the order of 90 clock cycles.

Unfortunately, the use of a higher modulator orders entails stability problems on account of the use of feedback in the modulator. Alternative approaches use multiple modulators cascaded together to achieve higher order thus better resolution, but this is at the cost of increased system complexity, die area and power consumption.

Sensors are readily used for a multitude of applications, many of which employ sensors operating in a duty-cycled mode. In such a mode, a sensor wakes up, makes a measurement and goes back to sleep. During its active state, or while not asleep, such a sensor consumes power. Inasmuch as low-power operation is a desirable feature for a sensor, it would be useful to complete a measurement in the shortest possible timeframe.

Many sensors are capable of producing a digital reading corresponding to the sensor output. Such sensors may include one or more analog-to-digital converters (ADCs) which are devices responsible for measuring a continuous quantity such as voltage, current, or charge and producing a numerical, digital output proportional to that voltage, current or charge. In some applications, sensors generate outputs that may represent the physical quantity being measured in terms of voltage, current or charge. Therefore, by combining a sensor with an analog-to-digital converter, a sensor may be capable of representing a quantity to be sensed with a digital number and provide that number as an output.

For example, a temperature sensor may measure temperature by first representing the temperature as a voltage, current or charge. Subsequently, that voltage, current or charge may be applied to an ADC to produce a digital output. By such an arrangement, a digital temperature sensor is formed.

As in temperature sensing, many other sensor applications may require high resolution and low-power operation. There is thus a need of a signal quantizer achieving high resolution within a short timeframe so that measurement time and therefore power consumption are minimized.

SUMMARY

Briefly, an embodiment of the invention includes a signal quantizer that has a summing junction, a loop filter, a quantizer and a reconstruction filter. The summing junction is responsive to an input signal and to a modulated signal and is operative to combine the modulated signal and the input signal to generate a summing junction output. The loop filter is responsive to the summing junction output and is operative to generate a loop filter output and has a regenerative gain associated therewith. The quantizer is responsive to the loop filter output and is operative to generate the modulated signal. The reconstruction filter is responsive to the modulated signal and is operative to generate a quantized output signal and has a second regenerative gain associated therewith that is substantially equal to that of the loop filter.

A further understanding of the nature and the advantages of particular embodiments disclosed herein may be realized by reference of the remaining portions of the specification and the attached drawings.

BRIEF DESCRIPTION OF THE DRAWINGS

FIG. 1b shows further details of the signal quantizer of FIG. 1a.

FIG. 2 shows a sensor incorporating a signal quantizer, in accordance with another embodiment of the invention.

FIG. 3 shows a component of a temperature sensor, in accordance with an embodiment of the invention.

FIGS. 4a and 4b show alternative embodiments of some of the structures of FIG. 2.

DETAILED DESCRIPTION OF EMBODIMENTS

The following description describes a signal quantizer. The signal quantizer, having a regenerative gain, exhibits high resolution and reduced power consumption, as discussed below.

In the descriptions to follow, an "analog" signal refers to a signal that is continuous in time and/or amplitude, whereas, a "digital" signal refers to a signal that is discrete in both time and in amplitude. A "discrete-time" analog signal, as used herein, refers to an analog signal that is continuous in amplitude but discrete in time, whereas a "continuous-time" analog signal is continuous in both amplitude and time.

Particular embodiments and methods of the invention disclose a signal quantizer that has a summing junction, a loop filter, and a quantizer. The summing junction is responsive to an input signal and to a modulated signal and is operative to combine the modulated signal and the input signal to generate a summing junction output. The loop filter is responsive to the summing junction output and is operative to generate a loop filter output and has a regenerative gain associated therewith. The quantizer is responsive to the loop filter output and is operative to generate the modulated signal.

In other embodiments, the signal quantizer further includes a reconstruction filter with a regenerative gain that is substantially equal to that of the loop filter.

In the descriptions to follow, the term "regenerative gain" refers to the use of positive feedback or similar arrangement in a filter that causes signal regeneration to occur. Accordingly, a filter incorporating a regenerative gain may be considered and referred to herein as a "regenerative filter". In particular, the loop filter and reconstruction filter according to the invention possess regenerative gains. Similarly, a modulator incorporating a regenerative filter may be referred to as a "regenerative modulator".

For example, when used in sensor applications, the signal quantizer utilizes minimal power by reducing the time required to accomplish analog-to-digital conversion.

The reduction in conversion time relates to the use of regenerative gain by the signal quantizer, as will be explained below. The resolution of the signal quantization is high in the measurement of voltage, current or charge. Accordingly, embodiments of the invention are directed at providing a signal quantization method and apparatus featuring a reduction in conversion time while maintaining suitably high resolution through the use of regeneration.

Figure 1A:
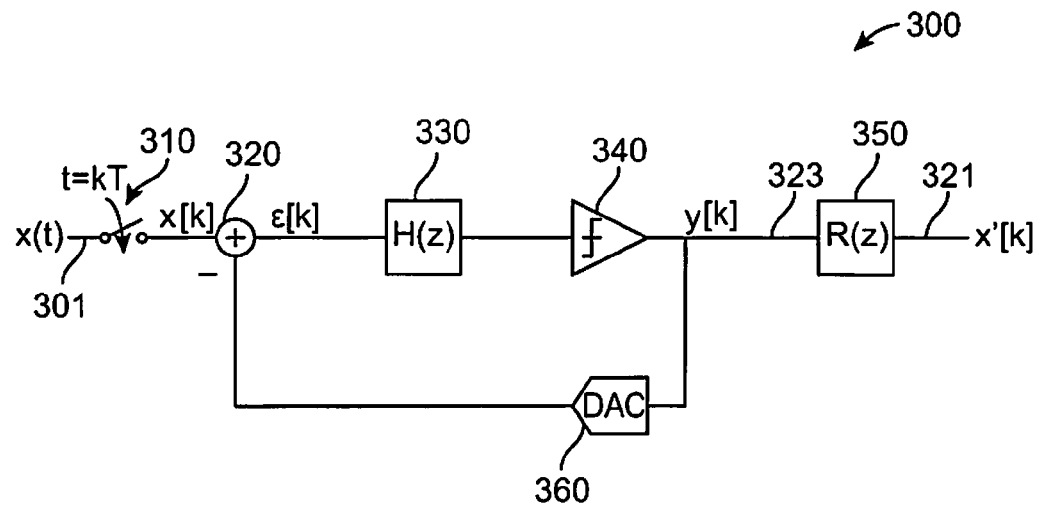
FIG. 1a shows a signal quantizer, in accordance with an embodiment of the invention.

Referring now to FIG. 1a, a signal quantizer 300 is conceptually shown, in accordance with an embodiment of the invention. In various embodiments, the signal quantizer 300 performs signal quantization or analog-to-digital conversion, the functions of which are known to those in the art. In some embodiments of the invention, the signal quantizer 300 is a sigma-delta modulator, also known in the art.

The signal quantizer 300 is shown to include a sampler 310, a summing junction 320, a loop filter 330, a quantizer 340, a digital-to-analog converter (DAC) 360, and a reconstruction filter 350. The transfer function of the loop filter 330 is conceptually indicated as "H(z)" with corresponding impulse response h[k], and that of the reconstruction filter 350 is indicated as "R(z)" with corresponding impulse response r[k].

The summing junction 320 is shown coupled to the loop filter 330, which is shown coupled to the quantizer 340. The quantizer 340 is shown coupled to the DAC 360 and to the reconstruction filter 350. An analog signal, x(t), serves as the input signal to the signal quantizer 300 and it is sampled by the sampler 310, which generates the sampled input signal, x[k]. In this example, x[k] is a discrete-time analog signal. The output of the signal quantizer 300 is shown to be x'[k]. and x'[k] is effectively a digitized estimate of the input signal x(t).

In an alternate embodiment of the invention, rather than employing a sampler, such as the sampler 310, input signal $301_{[DSI]}$, which is a continuous-time analog signal, is directly added to the output of the DAC 360 by the summing junction 320 with no sampling of x(t) being performed prior to summing it. In such an embodiment, sampling may instead be performed, for example, by the quantizer 340.

In another embodiment of the invention, the input signal x[k] may be a digital signal, in which case DAC 360 is not needed, as the modulated signal, y[k], may be applied directly to the summing junction 320.

The summing junction 320 combines the sampled input signal x[k] with the output of the DAC 360 or the modulated signal, y[k], as the case may be, to generate the summing junction output, which is provided as input to the loop filter 330. The loop filter 330 applies a regenerative gain to the summing junction input to generate the loop filter output, which is provided as input to the quantizer 340. The quantizer 340 functions like a comparator and produces the modulated signal, y[k], which is in digital form. In some embodiments, the output of the DAC 360 is subtracted from x[k] by the summing junction 320.

In accordance with the various embodiments of the invention, by sampling the input signal, x(t), at a much faster sample rate than the Nyquist bandwidth of x(t), it becomes possible to reconstruct a high resolution estimate, the output signal, x'[k], even if the intermediate quantity, the modulated signal, y[k], has very limited resolution. For example, in some of the various embodiments of the invention, a 1-bit resolution for the modulated signal y[k] (corresponding to using a simple comparator) is used while a 12-bit resolution estimate, the output signal x'[k], is reconstructed. On account of the use of a sample rate far in excess of the Nyquist bandwidth of the input signal, x(t), such converters may be referred to as oversampled converters. Note that the estimate, or the output signal, x'[k], is a quantized representation of the analog signal, x(t).

A limitation of oversampled converters with limited resolution for the modulated signal y[k] is that reconstruction of a high resolution estimate x'[k] can take many computational cycles. For example, in the case of a single-bit, single feedback loop sigma-delta modulator, let the impulse response of the loop filter 330 be represented as h[k]. It can be shown that the resolution of the converter is of the order:

$$r \sim \frac{1}{\sum_{k=1}^{M} h[k]} \qquad \text{Eq. (1)}$$

where M is the number of clock cycles used to form an estimate. Therefore, to perform high-resolution quantization in the fewest number of clock cycles, it is essential to have an impulse response, h[k], that accumulates to as large a sum as possible in M clock cycles.

As noted above, the loop filter 330 according to the invention has associated therewith a regenerative gain (or "feedback coefficient"), $\beta_1$, with a value that is greater than one causing the loop filter 330 to employ positive feedback and to possess regenerative gain. An exemplary impulse response, h[k], of the loop filter 330 is as follows:

$$h[k] = \beta^{k-1} \qquad \text{Eq. (2)}$$

Because $\beta_1 > 1$, h[k] of the loop filter 330 accumulates to a comparatively large value in comparatively few clock cycles on account of the use of regeneration. For example, if $\beta_1 = 1.414$, then the accumulated value after M cycles is approximately:

$$\sum_{k=1}^{M} h[k] = (1+\sqrt{2})(2^{M/2}-1) \qquad \text{Eq. (3)}$$

For such a loop filter, the corresponding modulator can achieve 12-bit resolution in only about 22 clock cycles. This represents a significant reduction in the number of clock cycles required to achieve 12-bit resolution, compared to a first-order modulator (~4,096 cycles) or a second-order modulator (~90 cycles). Advantageously, the signal quantizer 300 offers a simple signal quantization approach, similar to a sigma-delta modulator, achieving high resolution with low latency in a simple topology (in this example, employing only a single integrator stage). This reduction in latency can be useful for achieving high resolution quantization on low power consumption.

Examining the operation of signal quantizer 300 in more detail, it can be shown that if the sampled input signal, x[k], is approximately constant and equal to $x_0$ over a measurement interval of M cycles, that the modulated signal, y[k], and the input $x_0$ are related as follows:

$$x_0 = \frac{y*h + w[M]}{\sum_{k=1}^{M} h[k]} \approx y * \frac{h}{\sum_{k=1}^{M} h[k]} = y * \kappa h \qquad \text{Eq. (4)}$$

where the '*' denotes convolution. In this expression, an error term, w[M], exists at the end of M cycles. This term has order unity and its contribution is reduced by the accumulated impulse response h[k] taken over M cycles. Since h[k] accumulates to a large number, the error term can be neglected and an estimate x'[k] of the signal x[k] can be formed by using a reconstruction filter with an impulse response r[k]=Kh[k], where K is a constant that is inversely proportional to the accumulated impulse response h[k] taken over M cycles.

Therefore, a reconstruction filter 350 operable to produce a high-resolution estimate of the sampled input signal, x[k], has an impulse response, r[k], substantially proportional to the loop filter impulse response, h[k], and has associated therewith a regenerative gain, $\beta_2$, that is substantially equal to $\beta_1$, causing the output signal, x' [k], to be a close estimate of the input signal, x(t).

Figure 1B:
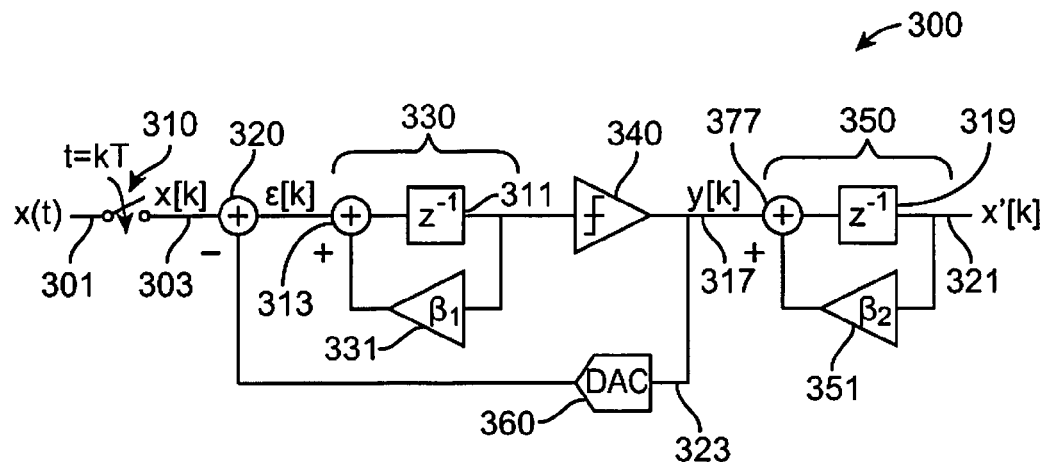

FIG. 1b conceptually shows further details of the signal quantizer 300. Namely, the loop filter 330 is shown to include a loop filter delay 311, a summing junction 313, and a regenerative gain 331, and the reconstruction filter 350 is shown to include a reconstruction delay 319, a summing junction 377 and a regenerative gain 351.

As shown in FIG. 1b, the summing junction 313 receives the output of the junction 320, or error signal ϵ[k], and adds the previous loop filter output multiplied by regenerative gain ($\beta_1$) 331 and generates the result of the foregoing operation to the delay 311. The regenerative gain $\beta_1$ 331 is applied to the output of the delay 311 and as such provided to the summing junction 313.

Similarly, the summing junction 377 receives the output of the quantizer 340 as one of its inputs and adds the previous reconstruction filter output multiplied by regenerative gain ($\beta_2$) 351 to generate an input provided to the delay 319. The regenerative gain ($\beta_2$) 351 is applied to the output of the delay 319 and as such provided to the summing junction 377.

Each of the filters 330 and 350 serves as an integrator with a corresponding regenerative gain that are substantially equal to each other where each regenerative gain can be considered a feedback coefficient, as each is in a feedback path of a corresponding integrator.

In the embodiment of FIG. 1b, the loop filter 330 uses a single integrator stage where the feedback coefficient 331 has a value $\beta_1 > 1$. Thus, the loop filter 330 employs positive feedback. For this reason, the loop filter may be considered and referred to herein as a "regenerative filter" and the loop filter possesses regenerative gain. Similarly, a modulator incorporating a regenerative filter may be referred to as a "regenerative modulator".

Reconstruction of the estimate, or the output signal, x' [k], is further provided by using the reconstruction filter 350. Reconstruction filter 350 is configured as an integrator with a regenerative gain 351 has a value of $\beta_2$ that is greater than one, as in the case of $\beta_1$.

As previously indicated, $\beta_1$ is approximately equal to $\beta_2$ as mismatch between these coefficients can cause nonlinearity in the output, x'[k]. Greater degrees of mismatch can result in greater nonlinearity, for example. In some embodiments, the loop filter 330 may be an analog filter. For example, a switched-capacitor filter is a known technique that may be applicable. In that case, coefficient $\beta_1$ may relate to a ratio of capacitors. In some embodiments, reconstruction filter 350 may be a digital filter. In that case, coefficient $\beta_2$ may relate to a digital computation. Since the two coefficients may relate to dissimilar implementations, there is a possibility of mismatch between them. One method to maintain them to be substantially equal is to trim the value of one or the other or both coefficients. In some such embodiments, one or the other or both coefficients, $\beta_1$ and $\beta_2$ are programmable. Such is the case in the embodiment of FIGS. 1a and 1b.

The loop filter 330 and the reconstruction filter 350 have impulse responses that accumulate to a large values within a relatively few number of clock cycles by employing regeneration internally. In the art, discrete-time filters that possess regenerative properties are considered to have poles outside the unit circle. Continuous-time filters possessing regenerative properties are considered to have poles in the right-half-plane. Taken together, these filters represent a class of filters that may be suitable in the various embodiments of the invention. Additionally, finite impulse response (FIR) filters that mimick regenerative behavior over the interval required for quantization would be a possible alternative class of filters for use according to the present invention. Regeneration in a filter is associated with a rapidly growing impulse response whose rate of growth accelerates over time. Such rapid impulse response growth behavior—however it is provided—may be advantageous for use in signal quantization according to the various embodiments of the invention.

FIG. 2 shows a signal quantizer 400, in accordance with another embodiment of the invention. The quantizer 400 is analogous to the quantizer 300 with the addition of a sensing block 470. The block 470 provides a sensed signal, the input signal, x(t), representative of a physical quantity to be sensed. For example, x(t) may be representative of an acceleration, a rotation or angular rate, a magnetic field strength, a pressure or a temperature. The specific physical quantity may vary depending upon the specific sensing means. The sensed signal, x(t), is sampled by the sampler 410 and then further processed according to the embodiment of FIGS. 1a and 1b. One of ordinary skill will recognize that the sensing block 470 could alternatively provide the discrete-time signal, sampled input signal x[k], directly. Thus, discrete-time or continuous-time sensing block are compatible for use with the various embodiments of the invention. By this combination of sensing block and the signal quantization approach of FIGS. 1a and 1b, an improved sensor is provided with reduced conversion cycle time and all of the advantages accruing therefrom. One example of a sensor benefitting from reduced conversion cycle time is a temperature sensor.

In the embodiment of FIG. 2, the input signal, x(t), may be indicative of a sensed temperature. In other embodiments, the input signal, x(t), may be indicative of a sensed rotation, a sensed magnetic field, a sensed pressure, or a sensed acceleration.

FIG. 3 shows a component 500 of a temperature sensor, in accordance with an embodiment of the invention. The temperature sensor component 500 is a part of the sensing block 470. The component 500 conceptually illustrates temperature sensing in which a bipolar junction transistor (BJT) 510 is biased using current sources 520 and 521. The current source 520 is shown coupled to the BJT 510 via switch 530 and the current source 521 is shown coupled to the switch 531, which when activated, causes coupling of the current source 521 to the BJT 510. The BJT 510 has a base-emitter junction voltage ($V_{BE}$). The $V_{BE}$ of BJT 510 is a function of temperature and bias current. By taking the difference of $V_{BE}$ voltages obtained at two different current densities ($\Delta V_{BE}$), an output proportional to absolute temperature may be obtained, as follows:

$$\Delta V_{BE} = \frac{kT}{q} \ln(\rho) \qquad \text{Eq. (5)}$$

where $\rho$ is the ratio of current densities used in the measurement. In FIG. 3, the difference is computed by sequentially measuring $V_{BE}$ at two different time intervals corresponding to the application of two different bias currents. Other methods are also possible where the computation is performed in parallel using two transistors or by other designs familiar in the art.

Employing the sensing block 470 incorporating component 500 for generating $V_{BE}$ and $\Delta V_{BE}$ outputs in combination with the signal quantization methods of the invention can yield an improved temperature sensor with reduced latency and therefore lower power consumption. For example, the embodiments of FIGS. 4a and 4b illustrate how $V_{BE}$ and $\Delta V_{BE}$ measurements can be used in combination with the signal quantization method.

FIGS. 4a and 4b each show alternative embodiments of some of the structures of FIG. 2. In each of these figures, an input linearly related to absolute temperature and equal to $2\alpha\Delta V_{BE} - V_{REF}$ is provided to the input of the signal quantizer. In this expression, a is a constant of proportionality, $\Delta V_{BE}$ provides a voltage with linear dependence on temperature, and $V_{REF}$ is a constant offset voltage and largely independent of temperature. The constant voltage, $V_{REF}$, can be provided by taking a weighted sum of $V_{BE}$, which is complementary to absolute temperature and $\Delta V_{BE}$, which is proportional to absolute temperature. By appropriate selection of $\alpha$, the sum $V_{BE} + \alpha \Delta V_{BE}$ can be made largely independent of temperature, as is understood in the art.

The embodiment of FIG. 4a employs multiplier 660 corresponding to the DAC 460 in FIG. 2 for a special case where the modulated signal, y[k], is a one-bit sequence. The multiplier 660 accepts the modulated signal, y[k] as one input and the reference voltage, $V_{REF}$, as the other input. The multiplier 660 provides its output to the negative input of the summing junction 620. The multiplier output is therefore $\pm V_{REF}$, depending on the value of y[k]. The other input to the summing junction is $2\alpha\Delta V_{BE} - V_{REF}$, which is linearly related to absolute temperature. By this arrangement, it can be shown that the output of reconstruction filter 450, x'[k], will have an average value equal to the following:

$$\overline{x'[k]} = \kappa \left[ \frac{2\alpha\Delta V_{BE} - V_{REF}}{V_{REF}} \right] = \kappa \left[ \frac{2\alpha k T \ln(\rho)}{q V_{REF}} - 1 \right] \qquad \text{Eq. (6)}$$

which is a linear function of temperature that is to first order insensitive to process variation. In this expression, $\kappa$ is a constant. A simplification to the embodiment of FIG. 4a is found by recognizing that the error signal, $\epsilon$[k], at the output of the summing junction 620 takes on one of two values. For y[k]=1, $\epsilon$[k]=$-2V_{BE}$; for y[k]=$-1$, $\epsilon$[k]=$-2\alpha\Delta V_{BE}$. FIG. 4b illustrates an alternative implementation where multiplexer 780 selects between one of these two voltages depending on the value of y[k].

Figure 5:
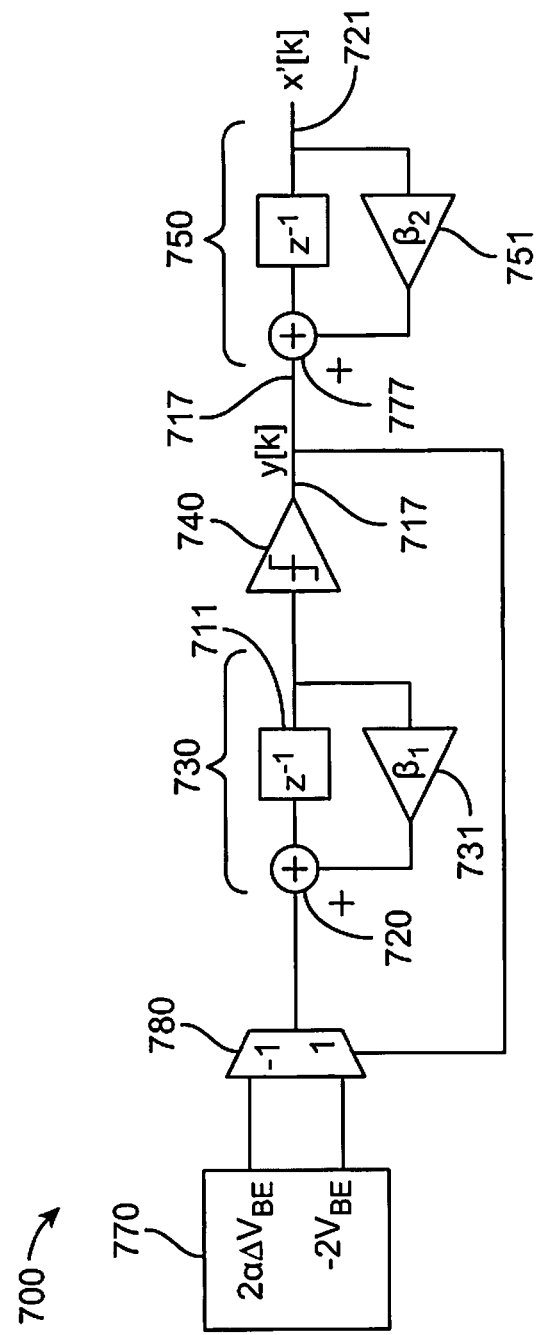
FIG. 5 shows a temperature sensor, in accordance with another embodiment of the invention.

FIG. 5 shows a temperature sensor 700, in accordance with another embodiment of the invention. The sensor 700 is analogous to the embodiments of FIGS. 1a and 1b except that one of the inputs of the summing junction 720 is generated by the multiplexer 780 which selects from one of the outputs of the temperature sensing block 770 based on y[k]. In this embodiment, temperature sensing block 770 supplies a first output proportional to absolute temperature (PTAT) $2\alpha\Delta V_{BE}$, and a second output that is complementary to absolute temperature (CTAT) $-2V_{BE}$. The PTAT output may be formed in a variety of ways familiar in the art, including by differencing the voltages of two p-n junctions biased at different current densities. The CTAT output may also be formed in a variety of ways familiar in the art, for example by taking the voltage of a single p-n junction. When the p-n junctions correspond to the base-emitter junctions of bipolar transistors, the voltage may be referred to for convenience as $V_{BE}$. In FIG. 5, this notation is adopted for the sole purpose of illustrating an example.

The temperature sensor 700 employs a regenerative quantizer that alternates between sampling the PTAT and CTAT outputs using multiplexer 780 according to the value of modulated signal y[k]. As previously described in reference to FIG. 4b, if y[k]=$-1$, then the next sample will be of value $2\alpha\Delta V_{BE}$. On the other hand, if y[k]=1, then the next sample will be of value $-2V_{BE}$.

The output of multiplexer 780 is provided to loop filter 730 with the loop filter 730 comprising feedback gain 731 whose nominal value is $\beta_1 > 1$. The output of the loop filter 730 is shown coupled to a 1-bit quantizer 740 providing modulated signal y[k]. The modulated signal, y[k], is reconstructed using reconstruction filter 750, which is shown comprising feedback gain 751 whose nominal value is $\beta_2 > 1$. It is desirable to have $\beta_1$ approximately equal to $\beta_2$.

The output of reconstruction filter 750 provides a high-resolution estimate of temperature. Specifically, it can be shown that the long-term average value of x'[k] will be:

$$\overline{x'[k]} = \kappa \left[ \frac{2\alpha\Delta V_{BE}}{V_{BE} + \alpha\Delta V_{BE}} - 1 \right] \qquad \text{Eq. (7)}$$

In this expression, K is a constant. By appropriate choice of coefficient $\alpha$, the quantity in the denominator of the expression can be made approximately constant over temperature. The quantity in the numerator is known in the art to be proportional to absolute temperature:

$$\alpha \Delta V_{BE} = \alpha \frac{kT}{q} \ln\left(\frac{I_2}{I_1}\right) \qquad \text{Eq. (8)}$$

where $I_2$ and $I_1$ are the bias currents corresponding to two $V_{BE}$ measurements, in this example. Provided that the ratio of these currents can be accurately maintained over temperature, the numerator is proportional to the absolute temperature. Therefore, the long-term average of x'[k] gives an indication of absolute temperature.

It should be understood that the loop filter 730 and the reconstruction filter 750 are reset after each conversion cycle. It may be noted that an accumulator with a feedback coefficient greater than unity is not stable as it's z-domain pole lies outside the unit circle. However, that is of no concern if the accumulator is operated for a finite number of clock cycles, which corresponds to how the accumulator is employed in the present invention. Note that an accumulator incorporating regenerative gain may be referred to as a regenerative accumulator.

In the various embodiments of the invention, a variety of resolutions is achievable by accumulating the modulated sequence, y[k], for differing numbers of clock cycles. In general, the resolution improves as the number of clock cycles in a single conversion is increased.

Figure 6:
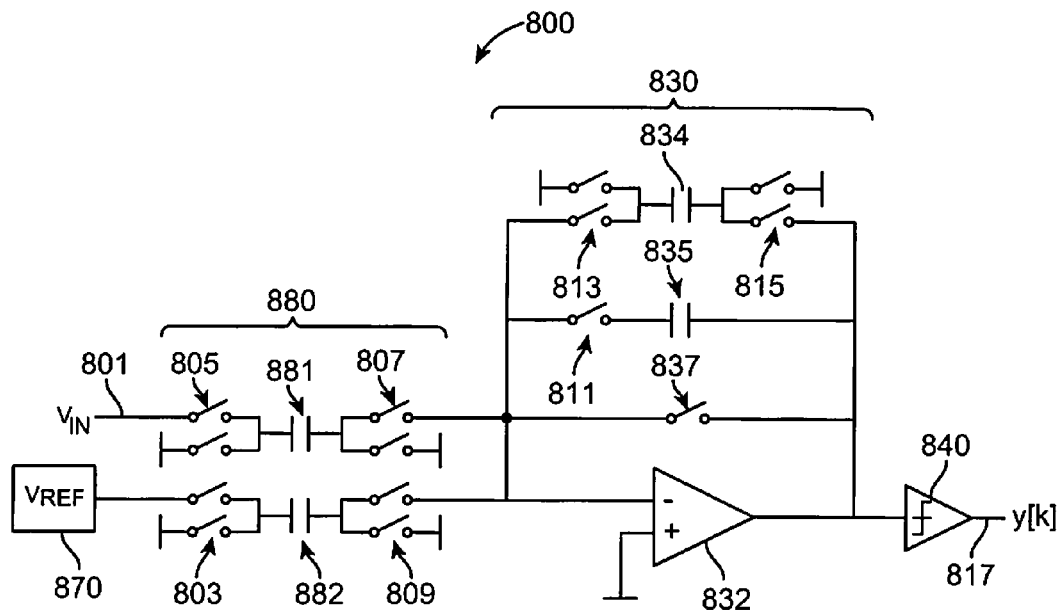
FIG. 6 shows a switched-capacitor device, in accordance with another embodiment of the invention.

FIG. 6 shows a switched-capacitor device 800, in accordance with another embodiment of the invention. The device 800 is shown to include a sampling network 880, responsive to $V_{IN}$ 801 and $V_{REF}$ 870, a loop filter 830, and a comparator 840. In this embodiment, the sampling network 880 comprises an input sampling capacitor 881 and associated switches, such as the switches 805 and 807, and a reference sampling capacitor 882 and associated switches, such as the switches 803 and 809.

The loop filter 830 is shown to include the amplifier 832, feedback capacitor 834 and associated switches 813 and 815, an integrating capacitor 835 and associated switch 811, and the reset switch 837.

The sampling network 880 is shown coupled to the loop filter 830. Further, the loop filter 830 is shown coupled to the comparator 840, which provides a 1-bit quantized output signal, modulated signal y[k], from the amplifier 832.

The device 800 of FIG. 6 operates in several phases. In a first phase ("phase 1"), input sampling capacitor 881 samples the input voltage, $V_{IN}$ 801, while reference sampling capacitor 882 samples either the reference voltage, $V_{REF}$ 870, or ground, depending upon the current value of y[k]. Specifically, if y[k]=1, then ground is sampled; if y[k]=−1, then $V_{REF}$ 870 is sampled. During sampling, both capacitors 881 and 882 are coupled to the input of amplifier 832. Also during this phase, switch 837 is coupled and the switch associated with integrating capacitor 835, switch 811, and the switches 813 and 815 are disconnected from the amplifier 832. Thus, capacitors 834 and 835 hold their prior charge. Switch 837 auto-zeroes the amplifier 832 and the amplifier offset is stored on the terminals of the capacitors 881 and 882 that are coupled to the amplifier 832 inputs.

In a second phase ("phase 2"), switch 837 is disconnected and the switch 811, associated with integrating capacitor 835, is coupled (or connected). Capacitors 881, 882 and 834 are discharged into the input of the amplifier 832 that is not coupled to ground, and the amplifier 832 acts to collect the sum of these charges onto integrating capacitor 835. More specifically, in the case where y[k]=1, the capacitor 882 is connected to $V_{REF}$ during phase 2. Alternatively, in the case where y[k]=−1, the capacitor 882 is connected to ground curing phase 2. This action causes a charge proportional to $+V_{REF}$ or $-V_{REF}$ to be collected, depending upon the sign of y[k].

In a third phase ("phase 3"), the sampling capacitors 881 and 882 are cleared by connecting both terminals to ground and feedback capacitor 834 samples the output voltage held by the integrating capacitor 835. Thus, the feedback factor, β, required for regenerative loop filter action is determined by the ratio of capacitor 834 to that of capacitor 835. Specifically, $\beta = 1 + C_{834}/C_{835}$. Also during this phase, the comparator 840 measures the polarity of the loop filter 830 output and sets y[k] accordingly.

The foregoing three-phase operation is repeated until enough samples of the modulated signal y[k] are collected to achieve the desired resolution. The high-resolution estimate of the input is formed by further processing y[k] in a digital reconstruction filter such as reconstruction filter 350 in FIG. 1a.

A limitation of the embodiment of FIG. 6 is that the offset voltage of amplifier 832 degrades the accuracy of the regenerative feedback process. First, a residue charge remains on capacitor 834 at the conclusion of the second operating phase due to amplifier offset. Second, the refresh of capacitor 834 during the third phase includes an offset charge due to amplifier offset. The embodiment of FIG. 7 addresses this limitation.

Figure 7:
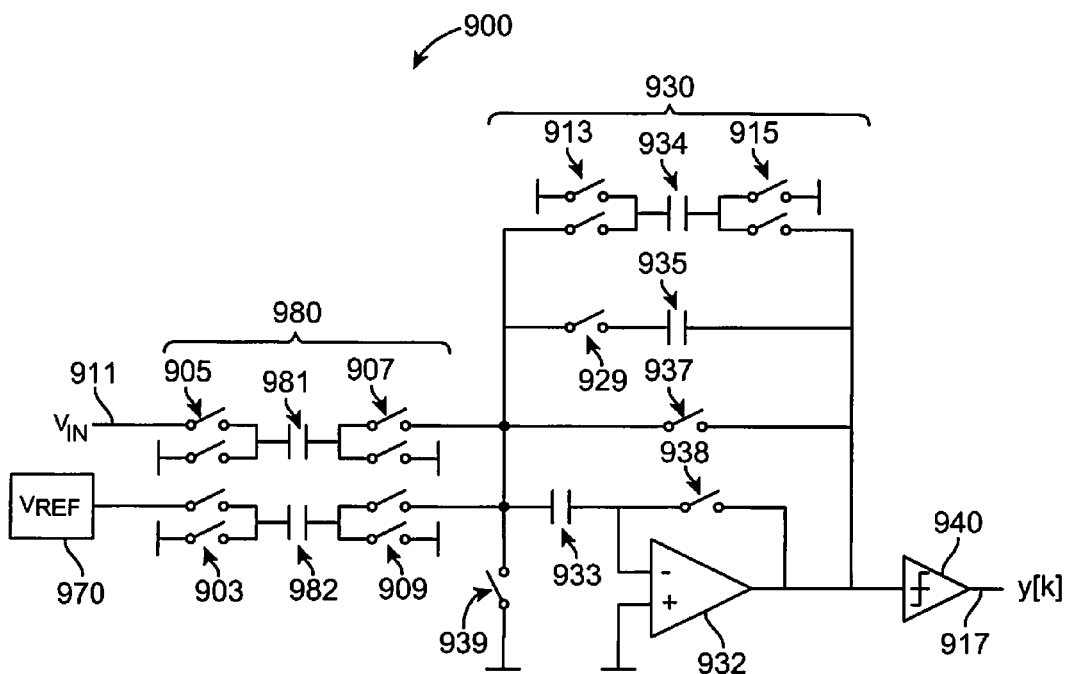
FIG. 7 shows a switched-capacitor device, in accordance with another embodiment of the invention.

FIG. 7 shows a switched-capacitor device 900, in accordance with another embodiment of the invention. The device 900 is analogous to the device 800 except that an additional operating phase is introduced that employs an auto-zero switch 938, an offset storage capacitor 933 and a shorting switch 939. The additional operating phase occurs prior to phase 1 in the sequence of the three operating phases discussed above. During this phase ("phase 0"), switches 938-939 are coupled (or connected) and switch 937 and the switches associated with capacitors 934-935, i.e. switch 913, switch 915, and switch 929, cause to disconnect their associated capacitors from the input of the amplifier 932. The amplifier 932 is auto-zeroed and its offset is stored in the capacitor 933, which is shown coupled to the input of the amplifier 932 that is not coupled to ground. In phase 1, switches 938-939 are disconnected and operation proceeds as previously described. Since the amplifier offset is stored in the capacitor 933, advantageously, the amplifier offset no longer affects the accuracy of the regenerative feedback process.

One familiar with the art of switched capacitor circuits will notice that noise is sampled onto capacitor 933 along with amplifier offset at the end of phase 0. The effect of this noise is suppressed during phase 1 operation when that sampled noise is placed on the bottom plates of the sampling capacitors 981 and 982 during the second auto-zero operation using switch 937. In subsequent phase 2, the charge integrated onto capacitor 935 will then be independent of the noise charge stored on capacitor 933.

The overall operation of the loop filter 930 may be referred to as double correlated double sampling because there are two auto-zero phases. In phase 0, the amplifier offset is sampled and correlated to subsequent operating phases. In phase 1, the noise charge developed on offset storage capacitor 933 is sampled on the bottom plates of capacitors 981-982 and thereby correlated to subsequent operating phases. By this means, both amplifier offset and noise due to sampling the amplifier offset are greatly suppressed. A limitation of the embodiment of FIG. 7 is that the accuracy of the regenerative feedback factor, β, relies on accurate matching of capacitors 935 and 934. Since $\beta = 1 + C_{934}/C_{935}$, the ratio of the two capacitors is critical in determining the feedback factor. Mismatch between them causes β to deviate from its ideal value and this deviation is a source of nonlinearity. The embodiment of FIG. 8 addresses this limitation.

Figure 8:
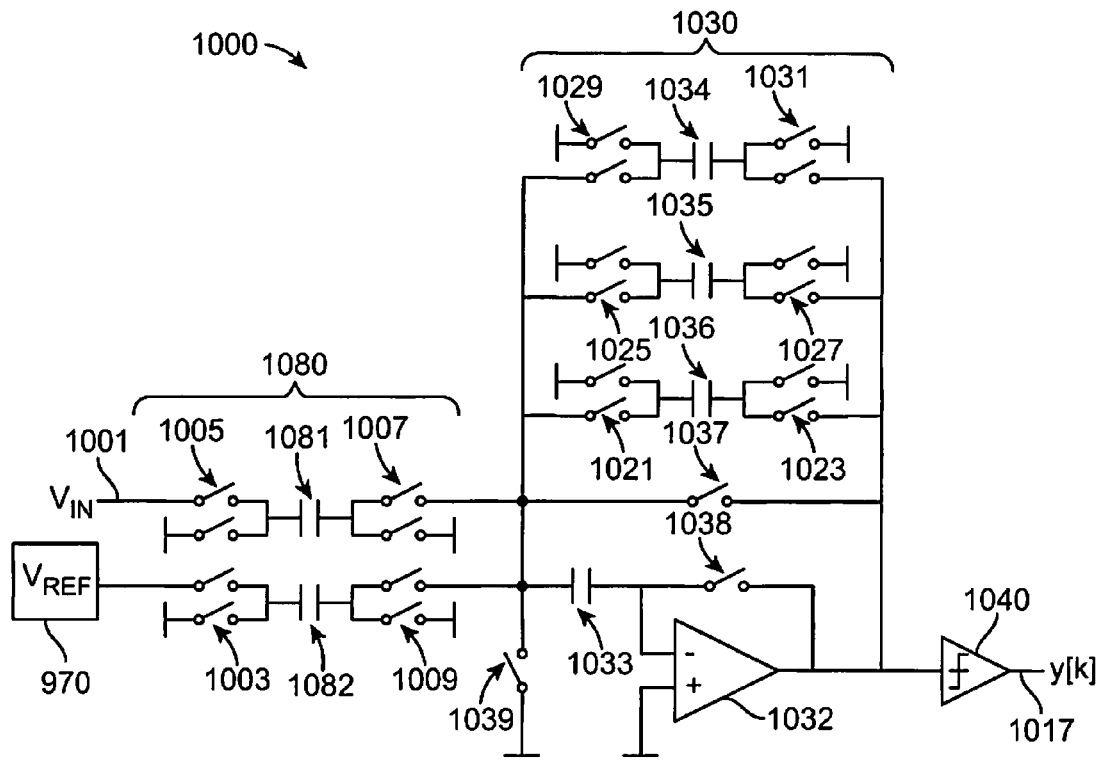
FIG. 8 shows a switched-capacitor device, in accordance with yet another embodiment of the invention.

FIG. 8 shows a switched-capacitor device 1000, in accordance with yet another embodiment of the invention. The device 1000 is analogous to the device 900 except that in the device 1000, the integrating capacitor 935 and feedback capacitor 934 of the device 900 are replaced with three nominally identical capacitors 1034-1036. During a given four-phase conversion sequence, two of these capacitors may serve as integrating capacitors while the third serves as a feedback capacitor. On subsequent sequences, the assignment of capacitors to integration or feedback roles may be rotated so that mismatch errors between and among them may be partially suppressed. This type of capacitor rotation to suppress mismatch errors is commonly known as dynamic element matching in the art.

In the embodiment of FIG. 8, three nominally identical capacitors 1034-1036 are used, with two of them at any given time serving in the role of integration capacitors while the remaining capacitor is used for regenerative feedback. By this method, we realize β=1+C/2C=1.5. With other arrangements of capacitors, it is possible to realize other useful values of β, as will be clear to one of ordinary skill. A convenient time to rotate the roles of capacitors 1034-1036 occurs at the end of phase 3 after the regenerative feedback capacitor of the preceding phase is refreshed and all three capacitors carry nominally identical charges. Apart from the introduction of dynamic element matching in FIG. 8, the embodiment operates similarly to that of FIG. 7.

Figure 9:
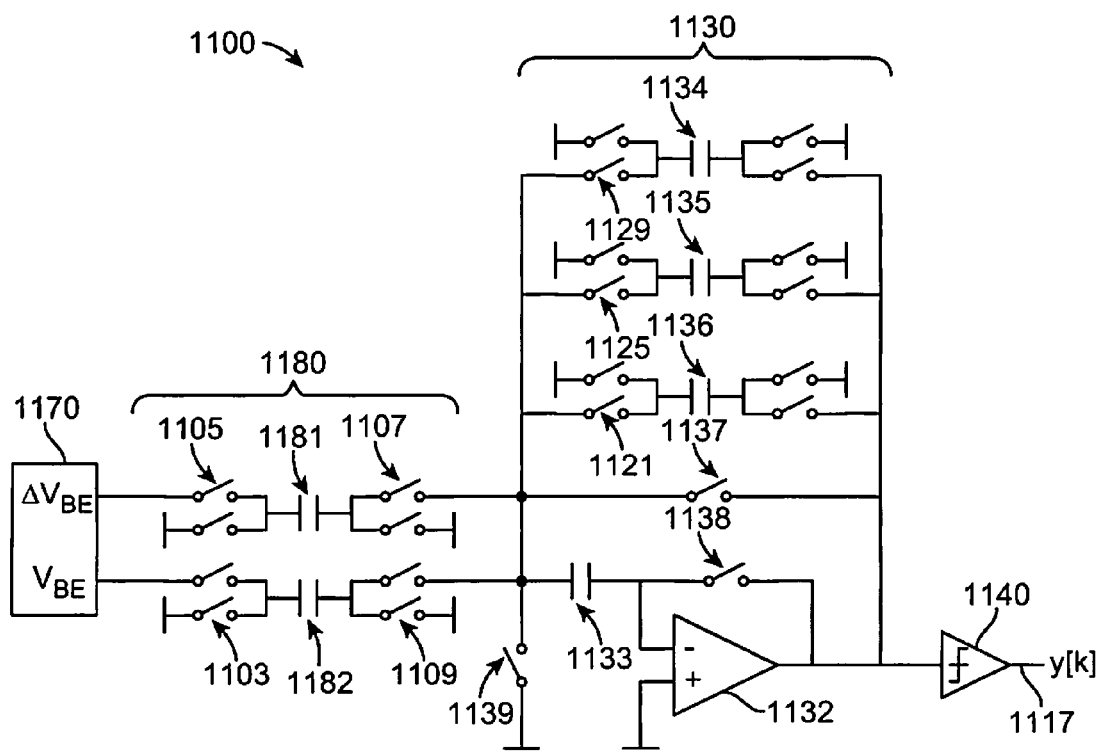
FIG. 9 shows a temperature sensor block, in accordance with an embodiment of the invention.

FIG. 9 shows a temperature sensor block 1100, in accordance with an embodiment of the invention. In this embodiment, a temperature sensing block 1170 provides two outputs: a first that is proportional to a difference in p-n junction potentials—$\Delta V_{BE}$—and a second that is proportional to a p-n junction potential—$V_{BE}$. These outputs are provided to the signal quantizer of FIG. 8, taking the place of $V_{IN}$ and $V_{REF}$. Consistent with the embodiment of FIG. 5, the output sequence, y[k] selects which of $V_{BE}$ or $\Delta V_{BE}$ is to be measured during a given conversion cycle. If y[k]=1, then $V_{BE}$ is measured; if y[k]=−1, then $\Delta V_{BE}$ is measured. The constant of proportionality, α, noted in reference to sensing means 770 of FIG. 5 are provided in the embodiment of FIG. 9 by virtue of the ratio of capacitors 1181 and 1182. The embodiment of FIG. 5 also requires that the signs for the $V_{BE}$ and $\Delta V_{BE}$ terms be opposite one another. This capability is provided in FIG. 9 by use of the input sampling switches associated with capacitors 1181 and 1182. For example, a positive sign is provided by first sampling an output during the first operating phase and then shorting the input terminal of the capacitor to ground during the second operating phase. Alternatively, a negative sign is provided by first shorting the input terminal of the capacitor to ground during the first operating phase and then connecting the input terminal of the capacitor to the sensing means output during the second operating phase. Thus, the two outputs $V_{BE}$ and $\Delta V_{BE}$ may be measured with either positive or negative sign. For example, the embodiment of FIG. 5 requires a positive sign for $\Delta V_{BE}$ measurements and a negative sign for $V_{BE}$ measurement. In other respects, the operation of the embodiment of FIG. 9 follows that of FIG. 8.

Figure 10:
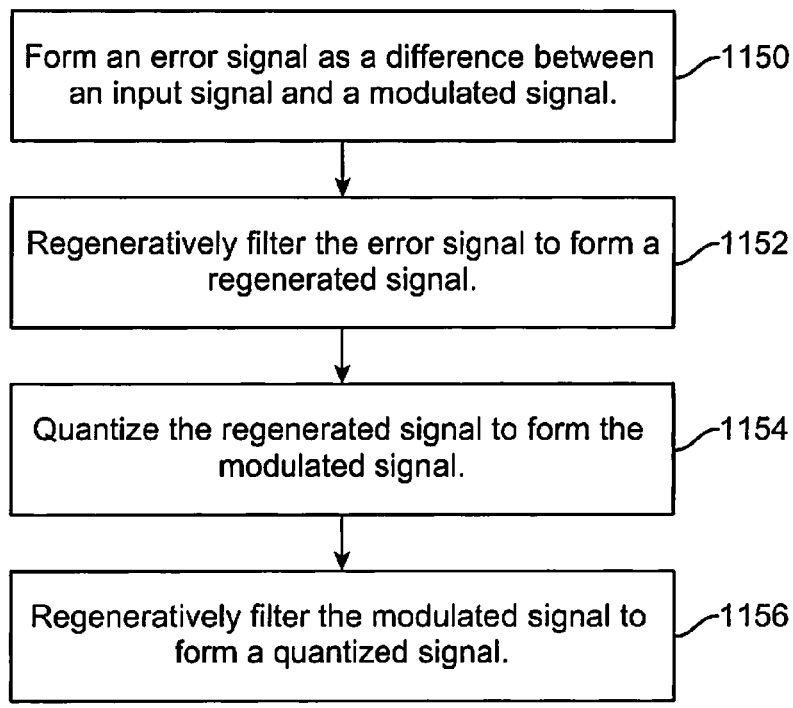
FIG. 10 illustrates a flow chart of the steps performed for forming a quantized signal, in accordance with a method of the invention.

Various methods of signal quantization are now described. FIG. 10 illustrates a flow chart of the steps performed for forming a quantized signal, in accordance with a method of the invention. In the flow chart of FIG. 10, an error signal is first formed as a difference between an input signal and a modulated signal, in accordance with a method of the invention. In an exemplary method and embodiment, the embodiment of FIG. 1a, summation block 320 performs this step, shown in FIG. 10, as step 1150. Next, at step 1152, the error signal is regeneratively filtered to form a regenerated signal. For example, with reference to the embodiment of FIG. 1a, loop filter 330 performs this step of the method. Next, at step 1154, the regenerated signal is quantized to form the modulated signal. For example, with reference to the embodiment of FIG. 1a, quantizer 340 performs this step of the method. Subsequently, at step 1156, the modulated signal is regeneratively filtered to form a quantized signal. For example, with reference to the embodiment of FIG. 1a, reconstruction filter 350 performs this step of the method. By virtue of this method, an input signal is efficiently quantized.

As described in reference to FIG. 4a and FIG. 4b, in the case of a temperature sensor, the step of forming an error signal as a difference between an input signal and a modulated signal can be replaced by the step of forming an error signal as a selection between a signal proportional to absolute temperature and a signal complementary to absolute temperature, wherein the selection is made based on the modulated signal value.

Figure 11:
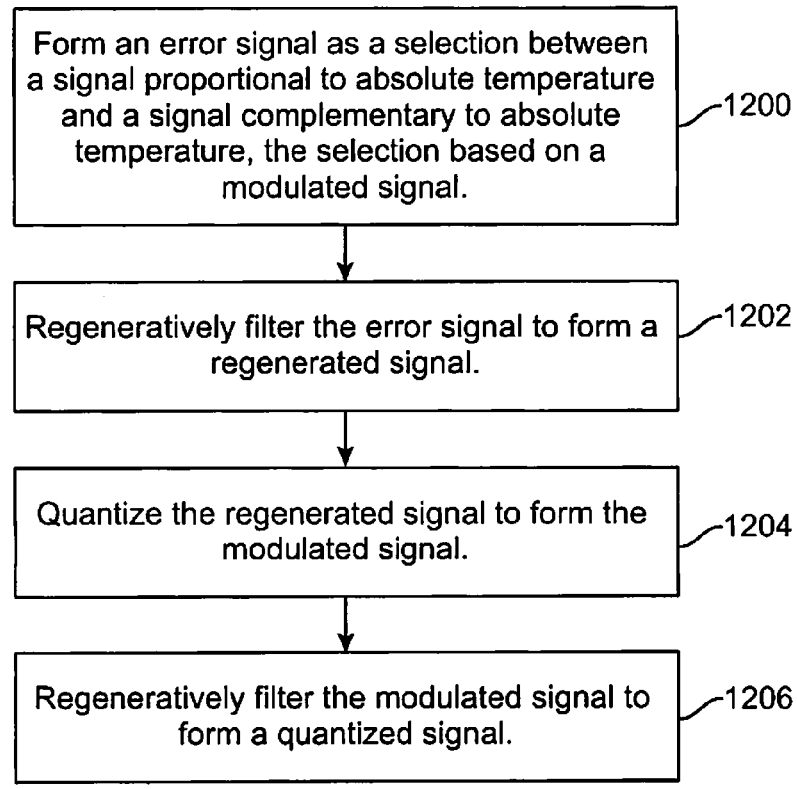
FIG. 11 illustrates a flow chart of the steps performed for forming a quantized signal, in accordance with another method of the invention.

FIG. 11 illustrates a flow chart of the steps performed for forming a quantized signal, in accordance with another method of the invention. Namely, the above-noted modification is incorporated. That is, at step 1200, in FIG. 11, the error signal is formed as a selection between a signal that is proportional to an absolute temperature and a signal that is complementary to the absolute temperature, with this selection being based on the modulated signal. Otherwise, the remaining steps of FIG. 11 are analogous to those of FIG. 10.

Figure 12:
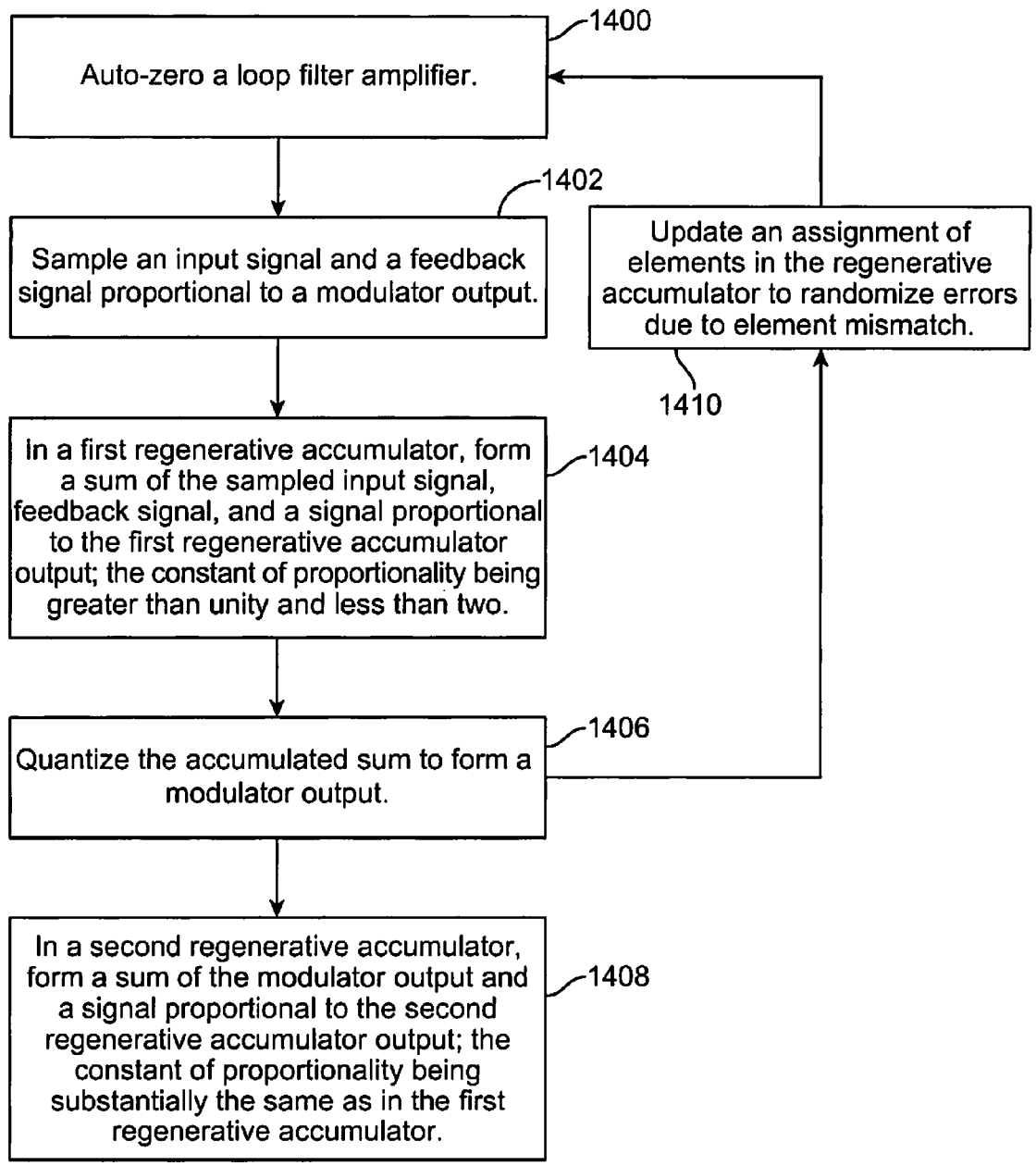
FIG. 12 shows a flow chart of the steps for signal quantization, in accordance with a method of the invention.

FIG. 12 shows a flow chart of the steps for forming a quantized signal, in accordance with another method of the invention. In this method, an amplifier is auto-zeroed in a first step. For example, with reference to the embodiment of FIG. 8, switches 1038-1039 and capacitor 1033 are operable to auto-zero amplifier 1032, as shown at step 1400.

Next, at step 1402, an input signal and a feedback signal proportional to a modulator output are sampled. For example, with reference to the embodiment of FIG. 8, sampling capacitor 1081 and its associated switches sample an input signal as a charge, and sampling capacitor 1082 and its associated switches sample a feedback signal proportional to a reference voltage as a charge whose polarity follows that of modulator output, y[k], by either sampling Vref and then discharging the capacitor 1082 (positive charge, when y[k]=−1) or by discharging capacitor 1082 and then charging it to Vref (negative charge, when y[k]=1).

Next, at step 1404, a first regenerative accumulator forms a sum of the sampled input signal, the feedback signal and a signal proportional to the first accumulator output; the constant of proportionality being greater than unity and less than two. For example, with reference to the embodiment of FIG. 8, an accumulator is formed out of amplifier 1032 and two of capacitors 1034-1036 and their associated switches. Capacitor 1081 provides the sampled input signal as a charge, capacitor 1082 provides the feedback signal as a charge, and the remaining capacitor of capacitors 1034-1036 provides the signal proportional to the accumulator output as a charge. The constant of proportionality is 1.5× for the embodiment of FIG. 8, which is greater than unity and less than two. Other constants of proportionality are also possible.

Next, at step 1406, the accumulated sum is quantized to form a modulator output. For example, with reference to the embodiment of FIG. 8, comparator 1040 quantizes the output of amplifier 1032 to one-bit resolution. Other resolutions are also possible.

Next, at step 1408, a second regenerative accumulator forms a sum of the modulator output and a signal proportional to the second accumulator output; the constant of proportionality being substantially the same as in the first accumulator. For example, with reference to the embodiment of FIG. 8, the output of comparator 1040 may be further processed by a digital reconstruction filter such as reconstruction filter 350 of FIG. 1a.

After step 1406, another step may be performed, at step 1410, where an assignment of elements in the accumulator to randomize errors due to element mismatch is updated. For example, with reference to the embodiment of FIG. 8, the assignment for purposes of step 3 of two of capacitors 1034-1036 to the function of forming a sum and one of capacitors 1034-1036 to the function of providing a charge proportional to the accumulator output is updated to modify the assignments for subsequent operation. By virtue of updating the capacitor assignments, the contribution of mismatch errors among the capacitors may be randomized. After step 1410, the process continues back to step 1400.

Figure 13:
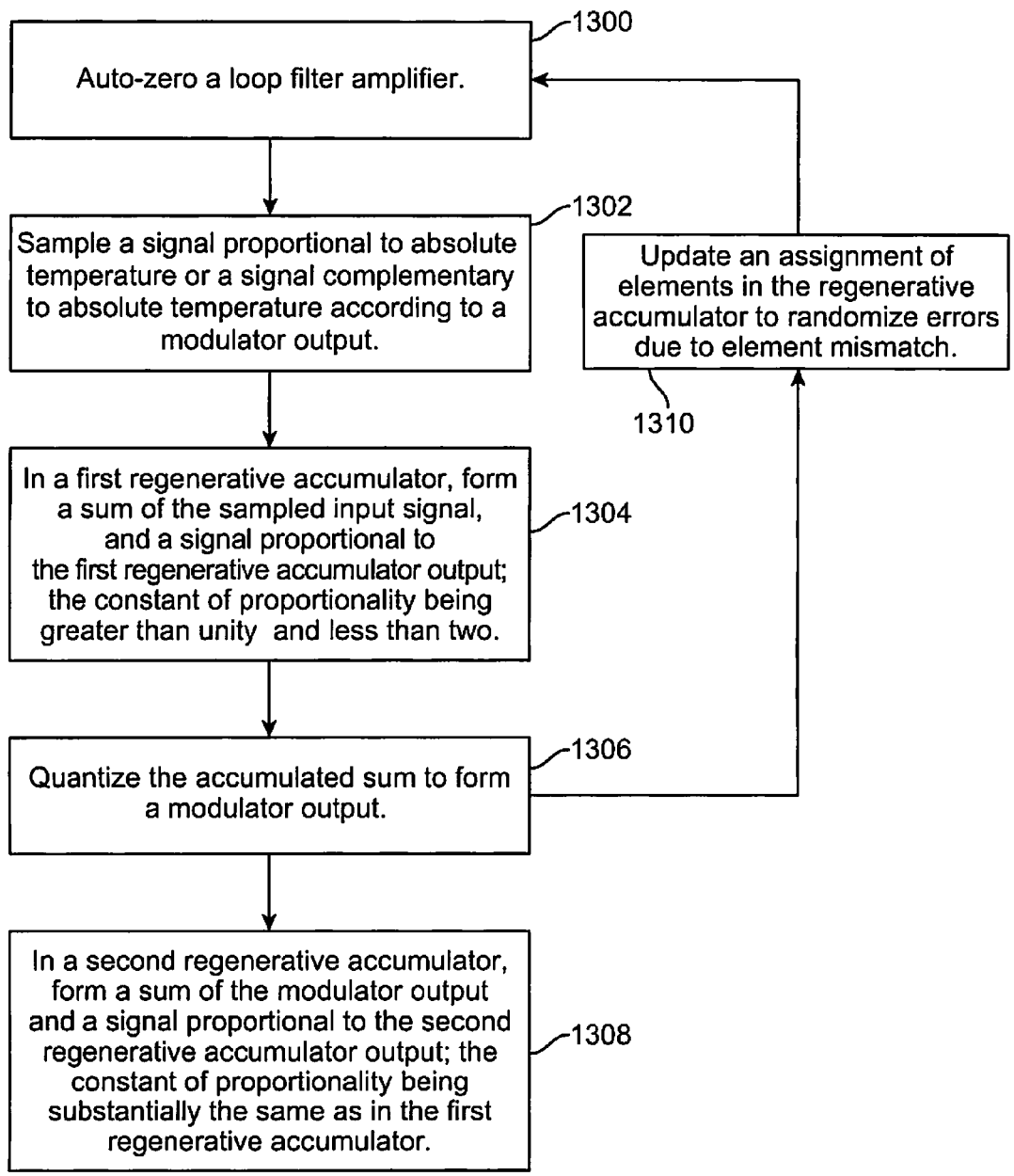
FIG. 13 shows a flow chart of the steps for signal quantization, in accordance with another method of the invention.

As described in reference to FIGS. 1a and 1b, in the case of a temperature sensor, the step of sampling an input signal and a feedback signal proportional to a modulator output can be replaced by the step of sampling a signal proportional to absolute temperature or a signal complementary to absolute temperature, wherein the selection is made according to a modulator output. FIG. 13 illustrates a method according to the invention incorporating this modification.

FIG. 13 shows a flow chart of the steps for forming a quantized signal, in accordance with another method of the invention. In this method, an amplifier is auto-zeroed, at step 1300. For example, with reference to the embodiment of FIG. 9, switches 1138-1139 and capacitor 1133 are operable to auto-zero amplifier 1132.

Next, at step 1302, an signal proportional to an absolute temperature or a signal that is complementary to an absolute temperature according to a modulator output are sampled. Examples of signals were shown and discussed relative to FIG. 9 as being provided by sensing block 1170.

Next, at step 1304, a first regenerative accumulator forms a sum of the sampled input signal and a signal proportional to the first accumulator output; the constant of proportionality being greater than unity and less than two. For example, with reference to the embodiment of FIG. 9, an accumulator is formed out of amplifier 1132 and two of capacitors 1134-1136 and their associated switches. Capacitor 1181 provides the signal proportional to absolute temperature as a charge (in the case where y[k]=−1), capacitor 1182 provides the signal complementary to absolute temperature as a charge (in the case where y[k]=1), and the remaining capacitor of capacitors 1134-1136 provides the signal proportional to the accumulator output as a charge. The constant of proportionality is 1.5× for the embodiment of FIG. 9, which is greater than unity and less than two. Other constants of proportionality are also possible.

Next, at step 1306, the accumulated sum is quantized to form a modulator output. For example, with reference to the embodiment of FIG. 9, comparator 1140 quantizes the output of amplifier 1132 to one-bit resolution. Other resolutions are also possible.

Next, at step 1308, a second regenerative accumulator forms a sum of the modulator output and a signal proportional to the second accumulator output; the constant of proportionality being substantially the same as in the first accumulator. For example, with reference to the embodiment of FIG. 9, the output of comparator 1140 may be further processed by a digital reconstruction filter such as reconstruction filter 350 of FIG. 1a.

After step 1306, another step may be performed, at step 1310, where an assignment of elements in the accumulator to randomize errors due to element mismatch is updated. For example, with reference to the embodiment of FIG. 9, the assignment for purposes of step 3 of two of capacitors 1134-1136 to the function of forming a sum and one of capacitors 1134-1136 to the function of providing a charge proportional to the accumulator output is updated to modify the assignments for subsequent operation. By virtue of updating the capacitor assignments, the contribution of mismatch errors among the capacitors may be randomized. After step 1310, the process continues back to step 1300.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A signal quantizer, comprising:
    a summing junction responsive to a first input signal and to a modulated signal, the summing junction operative to combine the modulated signal and the first input signal to generate a summing junction output; and
    a loop filter responsive to the summing junction output and operative to generate a loop filter output, the loop filter having a first regenerative gain associated therewith; and
    a quantizer responsive to the loop filter output and operative to generate the modulated signal.

2. The signal quantizer of claim 1, further comprising a sensing block coupled to the summing junction, the sensing block operative to generate the input signal.

3. The signal quantizer of claim 1, wherein the first input signal is an analog signal.

4. The signal quantizer of claim 1, wherein the first input signal is a digital signal.

5. The signal quantizer of claim 3, wherein the first input signal is further a continuous-time analog signal; the first input signal is sampled, and the sampled first input signal is provided to the summing junction.

6. The signal quantizer of claim 3, wherein the first input signal is further a continuous-time analog signal; the first input signal is provided to the summing junction without sampling, and the loop filter output is sampled by the quantizer.

7. The signal quantizer of claim 3, further comprising:
    a digital-to-analog converter responsive to the modulated signal and operable to convert the modulated signal to analog form before the modulated signal is received by the summing junction.

8. The signal quantizer of claim 2, wherein the input signal is indicative of a sensed temperature, a sensed rotation, a sensed magnetic field, a sensed pressure, or a sensed acceleration.

9. The signal quantizer of claim 1, further including a first reconstruction filter responsive to the modulated signal, the reconstruction filter having a second regenerative gain associated therewith and being operable to reconstruct a quantized signal corresponding to the input signal.

10. The signal quantizer of claim 9, wherein the first regenerative gain and the second regenerative gain are substantially equal.

11. The signal quantizer of claim 9, wherein at least one of the first or second regenerative gains is programmable.

12. . The signal quantizer of claim 1, wherein the summing junction combines the modulated signal and the input signal by summation.

13. The signal quantizer of claim 1, wherein the summing junction is responsive to a second input signal and is operable to select between the first input signal and the second input signal based on the modulated signal to generate the summing junction output.

14. The signal quantizer of claim 13, wherein the first input signal comprises a signal proportional to absolute temperature and the second input signal comprises a signal complementary to absolute temperature.

15. The signal quantizer of claim 1, wherein the loop filter employs dynamic element matching to increase the accuracy of the first regenerative gain.

16. The signal quantizer of claim 15, wherein the dynamic element matching is performed by the use of a plurality of capacitors, at least one of which is an integration capacitor and at least one of which is a feedback capacitor, the dynamic element matching allowing for compensation of a mismatch of the plurality of capacitors.

17. The signal quantizer of claim 1, wherein the loop filter employs correlated double-sampling to reduce the amplifier offset associated therewith.

18. The signal quantizer of claim 17, wherein the loop filter includes an amplifier having associated therewith an amplifier offset, the loop filter further including a auto-zero switch coupled to the amplifier and a capacitor coupled to the auto-zero switch and the amplifier, the capacitor operable to store the amplifier offset.

19. A method of signal quantization, comprising the steps of:
    forming an error signal based on an input signal and a modulated signal;
    regeneratively filtering the error signal, using a regenerative gain, to form a regenerated signal; and quantizing the regenerated signal to form the modulated signal.

20. The method of signal quantization, as recited in claim 19, wherein the forming step includes forming the error signal as a difference between the input signal and the modulated signal.

21. The method of signal quantization, as recited in claim 19, wherein the forming step includes selecting, based on the modulated signal, between a signal proportional to an absolute temperature and a signal complementary to an absolute temperature.

22. The method of signal quantization of claim 19, further comprising:
    regeneratively filtering the modulated signal to form a quantized signal.

23. The method of signal quantization, of claim 22, wherein the steps of regeneratively filtering the error signal and regeneratively filtering the modulated signal employ substantially equal regenerative gains.

24. A method of signal quantization, comprising the steps of:
    sampling an input signal and a feedback signal proportional to a modulator output;
    using a first regenerative accumulator having associated therewith a first constant of proportionality, forming a sum of the sampled input signal, the feedback signal and a signal proportional to an output of the first regenerative accumulator, the first constant of proportionality being greater than unity and less than two;
    quantizing the accumulated sum to form the modulator output; and
    using a second regenerative accumulator having associated therewith a second constant of proportionality, forming a second sum of the modulator output and a second feedback signal proportional to an output of the second regenerative accumulator output, wherein the second constant of proportionality is substantially the same as the first constant of proportionality.

25. The method of signal quantization of claim 24, further comprising the step of auto-zeroing a loop filter amplifier.

26. The method of signal quantization of claim 24, further including updating an assignment of elements in the first regenerative accumulator to randomize errors.

27. A method of signal quantization comprising the steps of:
    sampling a signal proportional to an absolute temperature or a signal complementary to an absolute temperature, based on a modulator output;
    using a first regenerative accumulator having associated therewith a first constant of proportionality, forming a sum of the sampled input signal and a signal proportional to an output of the first regenerative accumulator, the first constant of proportionality being greater than unity and less than two;
    quantizing the accumulated sum to form the modulator output; and
    using a second regenerative accumulator having associated therewith a second constant of proportionality, forming a sum of the modulator output and a signal proportional to an output of the second regenerative accumulator, wherein the second constant of proportionality is substantially the same as the first constant of proportionality.

28. The method of signal quantization of claim 27, further comprising the step of auto-zeroing a loop filter amplifier.

29. The method of signal quantization of claim 27, further including updating an assignment of elements in the first regenerative accumulator to randomize errors due to element mismatch.

30. A signal quantizer comprising:
    a loop filter responsive to an input signal and a modulated signal and operative to generate a loop filter output, the loop filter having associated therewith a first regenerative gain;
    a quantizer responsive to the loop filter output and operative to generate the modulated signal; and
    a reconstruction filter responsive to the modulated signal and operative to filter the modulated signal and thereby generate a quantized signal, the reconstruction filter having associated therewith a second regenerative gain.

31. The signal quantizer, as recited in claim 30, wherein the first and second regenerative gains are substantially the same.

32. The signal quantizer, as recited in claim 30, wherein at least one of the first and second regenerative gains is programmable.

33. The signal quantizer, as recited in claim 30, further comprising:
- a multiplier responsive to the modulated signal and operative to multiply the modulated signal with a reference voltage (Vref) to generate a multiplier output; and
- a summing junction responsive to the multiplier output and operative to combine the multiplier output with a voltage with magnitude less than Vref to generate an error signal that is used by the signal quantizer as the loop filter input signal.

34. The signal quantizer, as recited in claim 30, further comprising:
- a selection block responsive to the modulated signal and operative to select between a first and second input signals to generate an error signal that is used by the signal quantizer as the loop filter input signal.

35. The signal quantizer, as recited in claim 34, wherein:
the first input signal comprises a signal proportional to absolute temperature; and
the second input signal comprises a signal complementary to absolute temperature.

36. The signal quantizer, as recited in claim 9, further comprising:
- a sensing block coupled to the summing junction, the sensing block operative to generate the input signal.

37. A signal quantizer of claim 9, further comprising:
- a digital-to-analog converter responsive to the modulated signal and operable to convert the modulated signal to analog form before the modulated signal is received by the summing junction.

38. The signal quantizer of claim 1, wherein the regenerative gain is greater than one and less than two.

* * * * *